United States Patent [19]
Hudgens et al.

[11] Patent Number: 6,056,504
[45] Date of Patent: May 2, 2000

[54] ADJUSTABLE FROG-LEG ROBOT

[75] Inventors: Jeffrey C. Hudgens, San Francisco, Calif.; Tony R. Kroeker, Georgetown, Tex.

[73] Assignee: Applied Materials, Inc., Santa Clara, Calif.

[21] Appl. No.: 09/092,626

[22] Filed: Jun. 5, 1998

[51] Int. Cl.[7] .................................................. B25J 18/04
[52] U.S. Cl. ............................................................ 414/744.6
[58] Field of Search ........................... 414/744.1, 744.5, 414/744.6, 749

[56] References Cited

U.S. PATENT DOCUMENTS

| | | | |
|---|---|---|---|
| 3,757,962 | 9/1973 | Chavet | 414/749 X |
| 5,085,556 | 2/1992 | Ohtomi | 414/744.5 X |
| 5,227,708 | 7/1993 | Lowrance | 901/20 X |
| 5,447,409 | 9/1995 | Grunes et al. | 414/744.6 |
| 5,584,647 | 12/1996 | Uehara et al. | 414/744.5 |
| 5,713,717 | 2/1998 | Cho | 414/744.5 |

*Primary Examiner*—F. J. Bartuska
*Attorney, Agent, or Firm*—Dugan & Dugan

[57] ABSTRACT

An adjustable length frog-leg type wafer handler is provided. The wafer handler has two arms each having an upper portion and a lower portion. The lower portion may extend between a normal position and an extended position, and/or the upper portion may extend between an normal position and a compressed position. The adjusted positions (i.e., extended or compressed) are assumed as the wafer handler moves through a center position. Thus, the inventive wafer handler has a normally smaller arm length (as compared to conventional frog leg configurations) which in turn allows a smaller core axis of rotation (i.e., a smaller bladeless arm length). Therefore the blade used with the adjustable wafer handler may be longer by an amount equal to the difference between the normal and the adjusted arm lengths, without increasing the overall (i.e., the length of the arm and blade) retracted axis of rotation. The longer blade allows wafer placement within a processing chamber without requiring the wafer handler itself to enter the processing chamber.

23 Claims, 9 Drawing Sheets

6,056,504

ADJUSTABLE FROG-LEG ROBOT

BACKGROUND OF THE INVENTION

The semiconductor industry continuously seeks methods to reduce the cost per unit wafer processed. Factors affecting wafer processing costs include failure rates (e.g., arising from wafer contamination by particles, improper wafer transfer or placement) equipment costs, and clean room costs, among others.

The wafer handler dictates a large percentage of wafer processing costs due to the relative cost and complexity of the wafer handler and the large clean room area wafer handlers need for operation (i.e., their axis of rotation). Therefore, a wafer handler must be designed to reduce particle generation and/or to prevent particles from becoming air born, as well as to provide accurate-repeatable wafer placement.

A particularly advantageous wafer handler configuration, known as a "frog-leg" robot is disclosed in U.S. Pat. Nos. 5,447,409 and 5,227,708 (the entirety of both references is hereby incorporated by reference herein). As described therein such frog leg robots operate in a single plane, providing highly accurate wafer placement, and allowing frog leg robots to be driven by low-particle magnetic couplings. A conventional frog-leg robot is described below with reference to FIGS. 1A–E and 2.

FIGS. 1A–E are schematic top views sequentially showing the operation of a conventional frog-leg robot 11. The frog-leg robot 11 comprises a central hub 13 about which a first arm 15 and a second arm 17 rotate. The first arm 15 comprises a first upper portion 19 rotatably coupled to the central hub 13, and a first lower portion 21 rotatably coupled to the first upper portion 19 (forming a first elbow 23) and a first hand 25 rotatably coupled to the first lower portion 21 via a first wrist 27. Similarly, the second arm 17 comprises a second upper portion 29 rotatably coupled to the central hub 13, a second lower portion 31 rotatably coupled to the second upper portion 29 (forming a second elbow 33) and a second hand 35 rotatably coupled to the second lower portion 31 via a wrist 37. A blade 39 is coupled to both the first hand 25 and the second hand 35 at a distance half way between the first and second wrists 27, 37.

As shown in FIGS. 1A–E a wafer 41 is positioned on the blade 39, and the central hub 13 is positioned in front of the processing chamber 43 which encloses a wafer placement location 45. The processing chamber 43 comprises a wafer exchange port 47 through which the frog-leg robot 11 may transport wafers to and from the wafer placement location 45.

In order for the frog-leg robot 11 to extend from a retracted position (FIG. 1A) past a center position (FIG. 1C) to a placement position (FIG. 1E) the frog-leg robot 11 must be configured to satisfy the following equation:

$$L_{upper} \leq L_{lower} + \frac{1}{2} D_{wrist} \quad \{\text{equation 1}\}$$

wherein:

$L_{upper}$ is the length of the upper portion of the first arm and the length of the upper portion of the second arm;

$L_{lower}$ is the length of the lower portion of the first arm and the length of the lower portion of the second arm; and $D_{wrist}$ is the distance between the first wrist and the second wrist.

The need for the frog-leg robot 11 to satisfy the above equation is explained below with reference to the operation of the frog-leg robot 11.

In operation, the frog-leg robot 11 picks up the wafer 41 from a first location (not shown). Thereafter the frog-leg robot 11 assumes a retracted position and, while in the retracted position, rotates (e.g., 180°) to position the wafer 41 in front of the wafer exchange port 47 as shown in FIG. 1A.

To assume the retracted position the first upper portion 19 rotates clockwise and the second upper portion 29 rotates counterclockwise about the central hub 13, drawing the first elbow 23 and second elbow 33 backward (i.e., away from the processing chamber 43). Because the first arm 15 and the second arm 17 are coupled in a closed loop (e.g., because the first arm 15 and the second arm 17 are coupled via the first hand 25 and the second hand 35 and are both coupled to the central hub 13), the first lower portion 21 and the second lower portion 31 rotate about the first elbow 23, the first wrist 27 and the second elbow 33 and the second wrist 37, respectively, as the first elbow 23 and the second elbow 33 draw backward. Thus, in the retracted position the frog-leg robot 11 assumes its minimum overall length (i.e., has a length equal to the length of the lower arms 21, 31, and the length of the blade 39). As the retracted frog-leg robot 11 rotates, for example from the first location to alignment with the wafer exchange port 47, it occupies a minimum axis of rotation indicated by the dashed circle 49.

After the frog-leg robot 11 is aligned with the wafer exchange port 47, the first upper portion 19 rotates counterclockwise while the second upper portion 29 rotates clockwise about the central hub 13, causing the frog-leg robot 11 to reach forward (i.e., toward the processing chamber 43) until the frog-leg robot 11 assumes the object placement position as shown in FIG. 1E. Because the first arm 15 and the second arm 17 are coupled in a closed loop, the first lower portion 21 and the second lower portion 31 rotate about the first elbow 23, the first wrist 27 and the second elbow 33 and the second wrist 37, respectively.

The frog-leg robot 11 is shown sequentially in FIGS. 1A–E moving from the retracted position to the placement position. FIG. 1B shows the frog-leg robot 11 as it moves from a retracted position toward a center position, the first elbow 23 and the second elbow 33 being backward of the central hub 13. FIG. 1C shows the frog-leg robot 11 in a center position, with the first elbow 23 and the second elbow 33 directly in line with the central hub 13. FIG. 1D shows the frog-leg robot 11 as it moves from the center position toward the placement position, the first elbow 23 and the second elbow 33 being forward of the central hub 13. Finally, FIG. BE shows the frog-leg robot 11 in the placement position with the first elbow 23 and the second elbow 33 in line with the first wrist 27 and the wrist 37, respectively.

Because the first arm 15 and the second arm 17 are coupled in a closed loop, and because the first hand 25 and the second hand 35 are maintained perpendicular to the blade 39 (due to constraint of suitable mechanisms within the wrist—e.g., gears or belts), the frog-leg robot 11 must satisfy equation 1 in order for the frog-leg robot 11 to be capable of assuming the positions shown in FIGS. 1B–D. Moreover, in order to reach the wafer placement location 45, both the hands 25, 35 and the wrists 27, 37 must extend through the wafer exchange port 47, as best shown in FIG. 2.

FIGS. 2A and 2B are a schematic side elevational view and a schematic top plan view, respectively, of the wrists 27, 37 and the blade 39 of the frog-leg robot 11, extending through the wafer exchange port 47 to the wafer placement location 45. The wrists 27, 37, due to their moving parts (not shown) and the case 51 which encloses the moving parts (and encloses particles generated thereby) has a thickness (indicated by the arrow "A") and a width (indicated by the arrow "C") which are substantially greater than the thickness of the blade 39 (indicated by the arrow "B") and the width of the wafer exchange port 47 (indicated by the arrow "D"). Accordingly the wafer exchange port 47 must be wider than the case 51. Such large wafer exchange ports are undesirable because they may allow more particles to enter the processing chamber. Further, the case 51 may not completely isolate particles generated by the wrists and thus the robot 11 may be responsible for emitting particles within the processing chamber. Additionally, the wrists' precisely machined moving parts may be adversely affected by the atmosphere within the processing chamber 43 (e.g., by the chamber's temperature, pressure, chemicals, etc.). While a longer blade may successfully isolate the wrist from the processing environment, the inclusion of a longer blade would cause a significant processing cost increase. The dashed circle 49 would increase, requiring a larger clean room area for robot operation.

Accordingly, although frog-leg robots are desirable for their accurate, repeatable and inexpensive design, as well as for their low particle generation, a need exists for an improved frog leg robot that will allow the wrist to remain outside the process chamber without increasing the minimum axis of rotation.

SUMMARY OF THE INVENTION

The present invention provides an adjustable frog-leg robot. The inventive adjustable frog leg robot has a first arm having an upper portion rotatably coupled to a central hub, and a lower portion rotatably coupled to the upper portion, and has a second arm having an upper portion rotatably coupled to the central hub and a lower portion rotatably coupled to the upper portion of the second arm. At least one of the upper and lower portions of both arms is adjustable in length between a normal length and an adjusted length (e.g., a maximum and a minimum length). The adjustable portion allows a longer blade to be used without increasing the inventive robot's retracted axis of rotation, as compared to the retracted axis of rotation of a prior art robot having the same (maximum) arm length and a shorter blade length.

The adjustable portion of the inventive wafer handler allows the wafer handler to adjust between a maximum and a minimum length to satisfy the conventionally required equation $L_{upper} \leq L_{lower} + \frac{1}{2}D_{wrist}$ {equation 1} as the wafer handler moves through a center position, yet also allowing the wafer handler to have shorter lower arm portions, and thus to have a smaller retracted axis of rotation. Accordingly, the blade can be longer by an amount equal to the distance between the maximum and minimum adjustable lengths, without increasing the inventive wafer handler's retracted axis of rotation.

In a first embodiment the inventive wafer handler has a lower arm portion that adjusts between a normal length and an extended length. As the wafer handler travels through the center position the lower arm portions extend to satisfy the equation $L_{upper} \leq L_{lower} + \frac{1}{2}D_{wrist}$ {equation 1}. Thereafter in the retracted position the lower arm portions return to their normal (shorter) length, allowing the wafer handler to have a smaller retracted axis of rotation. The blade length may therefore be lengthened by an amount equal to the extended length of the lower arm portion minus the normal length of the lower arm portion ($L_{extended} - L_{normal}$) without causing the wafer handler's overall retracted axis of rotation to be greater than that of a conventional wafer handler having the same (maximum) arm length and a shorter blade length. Further reduction in the wafer handler's overall retracted axis of rotation can be achieved by extending the adjustable portion of the wafer handler when the wafer handler is in the placement position.

Similarly in a second embodiment the inventive wafer handler has an upper arm portion that adjusts between a normal length and a compressed length. As the wafer handler travels through the center position the upper arm portion compresses, thus allowing for a smaller lower arm portion while still satisfying the equation $L_{upper} \leq L_{lower\ (min)} + \frac{1}{2}D_{wrist}$ {equation 1} necessary to allow the wafer handler to pass through the center position. Thereafter in the retracted position the upper arm portions return to their normal (longer) lengths allowing the wafer handler to have a smaller retracted overall axis of rotation (due to the smaller lower arm portions). The blade length may therefore be lengthened by an amount equal to the normal length of the upper arm portion minus the compressed length of the upper arm portion ($L_{normal} - L_{compressed}$) without causing the wafer handler's overall retracted axis of rotation to be greater than that of a conventional wafer handler having the same (maximum) arm length and a shorter blade length.

In a further embodiment both the upper and lower portion of the arms may be extendible. In still another alternative embodiment the distance between the wrists may be extendible. The extendible wrists may be employed alone or in combination with extendible upper and/or lower arm portions.

The adjustable nature of the inventive wafer handler advantageously allows a longer blade to be employed without increasing the wafer handler's overall retracted axis of rotation as compared to that of a comparably sized conventional frog leg robot. Thus, with use of the present invention the wafer handler need not enter the potentially harmful processing environment. The processing chamber may have a smaller wafer exchange port, which in turn reduces the probability of processing chamber contamination.

Other objects, features and advantages of the present invention will become more fully apparent from the following detailed description of the preferred embodiments, the appended claims and the accompanying drawings.

DETAILED DESCRIPTION OF THE PREFERRED EMBODIMENTS

Figure 3A:
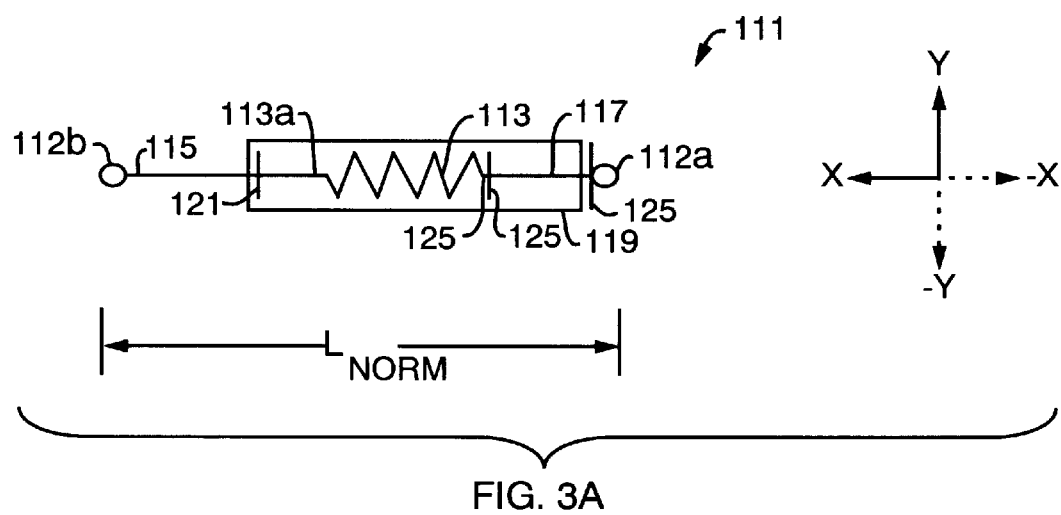
FIGS. 3A and 3B are side elevational views of a first embodiment of an adjustable portion of an inventive frog-leg robot.
Figure 3B:
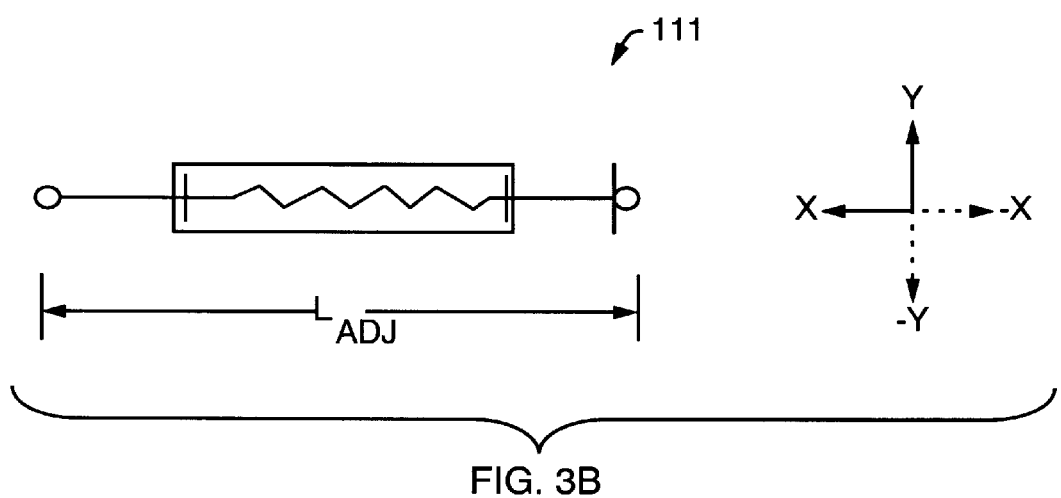

FIGS. 3A and 3B are side elevational views of a first embodiment of an adjustable portion of an inventive frog-leg robot. The first embodiment comprises an adjustable lower arm portion 111 shown in a compressed state (FIG. 3A) and in an extended state (FIG. 3B). The adjustable lower arm portion 111 comprises a first connector 112a and a second connector 112b that allow the adjustable lower arm portion 111 to rotatably connect to both an upper arm portion and a hand portion of an inventive frog-leg robot, as described below with reference to FIGS. 4A–E. Such rotatable connections are well known in the art and are therefore not further described herein.

Coupled between the first and second connectors 112a, 112b is an extension spring 113 that allows the adjustable lower arm portion 111 to extend and compress as described below. A first end 113a of the extension spring 113 couples the first connector 112a via a first rigid member 115, and a second end 113b of the extension spring 113 couples the second connector 11b via a second rigid member 117.

The first rigid member 115, the extension spring 113, and the second rigid member 117 form an adjustable lower arm portion that may extend and compress freely along a linear axis, such as the x axis of FIG. 3A. For instance, by fixing the second connector 112b and by exerting a force along the +x axis on the first connector 112a, the adjustable lower arm portion 111 stretches from its "normal" length $L_{norm}$ (FIG. 3A) to its adjusted length $L_{adj}$ (FIG. 3B).

Because the extension spring 113 is flexible (e.g., extendible and compressible), it lacks lateral rigidity (e.g., along the +y axis and −y axis of FIGS. 3A and 3B) such that any lateral (y axis) force will interfere with the linear (x axis) motion of the lower arm 111. To provide lateral support, a housing 119 is provided that surrounds the extension spring 113 and couples to the first rigid member 115 via a first linear bearing 121 and to the second rigid member 117 via a second linear bearing 123. The first and second linear bearings 121, 123 allow the housing 119 to slide relative to the extension spring 13, to the first rigid member 115, and to the second rigid member 117, so that the housing 119 continuously surrounds the extension spring 113 as the extension spring 113 extends and compresses. In this manner, the first rigid member 115, the second rigid member 117, and the housing 119 form a structure that is resistant to lateral (y axis) movement (due to the linear bearings and the slidable coupling therewith) yet capable of expanding and contracting along a desired direction (e.g., along the x axis of FIGS. 3A and 3B). In addition to providing lateral rigidity, the housing 119 contains any contaminants that may be generated during the extension and compression of the extension spring 113.

To limit the range of motion of the adjustable lower arm portion 111 a hard stop 125 is coupled adjacent the second connector 112b. The hard stop 125 sets the minimum length (e.g., $L_{norm}$) of the adjustable lower arm portion 111 by limiting the extension spring 117's compression (FIG. 3A). For example, the hard stop 125 may comprise a metal plate rigidly coupled to the second connector 112b. An opening (not shown) in the housing 119 (through which the second rigid member 117 passes as the extension spring 113 extends and compresses) is smaller than the metal plate and therefore prevents the plate from entering the housing 119 and allowing the extension spring 113 to further compress. The maximum length ($L_{adj}$) the lower arm portion 111 extends is determined by the maximum length to which the extension spring 117 (FIG. 3B) may extend.

FIGS. 4A–E are schematic top views sequentially showing the operation of an inventive frog-leg robot 131 which employs the adjustable lower arm portion 111 of FIGS. 3A and 3B. The frog-leg robot 131 comprises a central hub 133 about which a first arm 135 and a second arm 137 rotate. The first arm 135 comprises a first upper portion 139 rotatably coupled to the central hub 133, and a first adjustable lower portion 111a, the first connector 112a (FIGS. 3A–B) of which rotatably couples to the first upper arm 139 (forming a first elbow 143), and the second connector 112b (FIGS. 3A–B) of which rotatably couples to a first hand 145 (forming a first wrist 147).

Similarly, the second arm 137 comprises a second upper portion 149 rotatably coupled to the central hub 133, a second adjustable lower portion 111b, the first connector 112a (FIGS. 3A–B) of which rotatably couples to the second upper portion 149 (forming a second elbow 153) and the second connector 112b (FIGS. 3A–B) of which couples to a second hand 155 (forming a second wrist 157). A blade 159 is coupled to both the first hand 145 and the second hand 155 at a distance halfway between the first wrist 147 and the second wrist 157. As shown in FIGS. 4A–E a wafer 161 is positioned on the blade 159, and the central hub 133 is positioned in front of a processing chamber 163 which encloses a wafer placement location 165. The processing chamber 163 comprises a wafer exchange port 167 through which the frog-leg robot 131 may transport wafers to and from the wafer placement location 165.

In order to enable the inventive adjustable frog-leg robot to employ a longer blade without increasing the overall retracted axis of rotation, the adjustable frog-leg robot 131 is configured to satisfy the following equation:

$$L_{upper} > L_{lower(min)} + \tfrac{1}{2} D_{wrist} \quad \{\text{equation 2}\}$$

wherein:

$L_{upper}$ is the length of the upper portion of the first arm and the length of the upper portion of the second arm;

$L_{lower(min)}$ is the normal (shorter) length of the lower portion of the first arm and the normal (shorter) length of the lower portion of the second arm; and $D_{wrist}$ is the distance between the first wrist and the second wrist.

However, as discussed previously with regard to the conventional frog-leg robot 11 of FIG. 1A–E, in order for a frog-leg type robot to extend from a retracted position (FIG. 1A) past a center position (FIG. 1C) to a placement position (FIG. 1E), the frog-leg robot must be configured to satisfy the equation:

$$L_{upper} \leq L_{lower} + \tfrac{1}{2} D_{wrist} \quad \{\text{equation 1}\}$$

wherein:

$L_{upper}$ is the length of the upper portion of the first arm and the length of the upper portion of the second arm;

$L_{lower}$ is the length of the lower portion of the first arm and the length of the lower portion of the second arm; and $D_{wrist}$ is the distance between the first wrist and the second wrist.

Figure 4A:
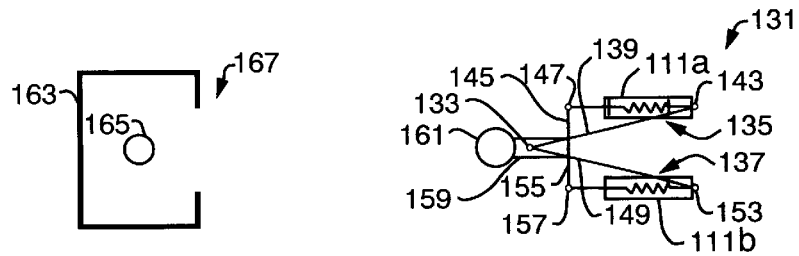
FIGS. 4A–E are schematic top views sequentially showing the operation of an inventive frog-leg robot which employs the adjustable lower arm portion of FIGS. 3A–B.
Figure 4B:
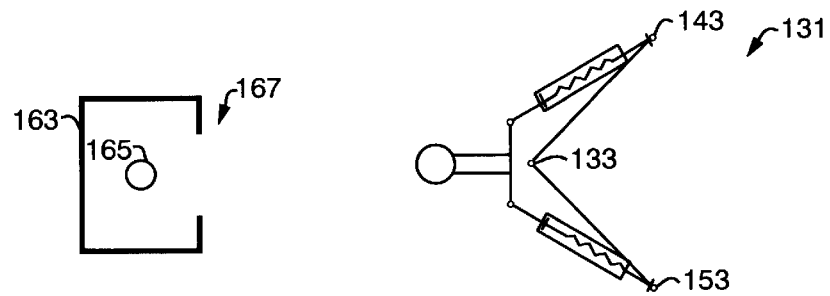
Figure 4C:
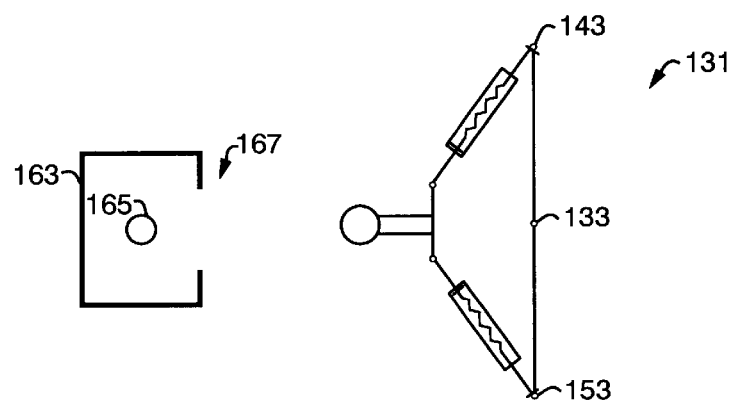
Figure 4D:
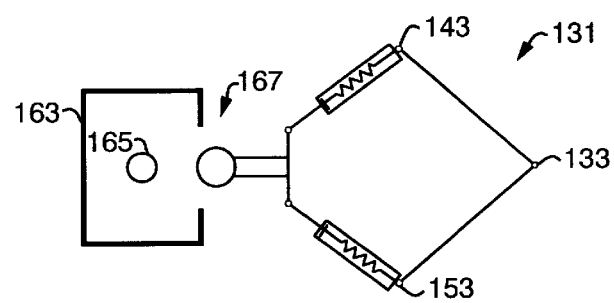

Accordingly, in order (1) to provide an increased blade length without increasing the overall retracted axis of rotation, and (2) to enable movement to/from a retracted position, past a center position, to/from a placement position; the adjustable lower arm portions 111a, 111b of the inventive frog-leg robot 131 adjust, assuming a normal (shorter) length, so as to satisfy equation 2, when retracted (FIG. 4A), and assuming an adjusted (longer) length, so as to satisfy equation 1, when passing through the center position (FIGS. 4B–D).

In operation, the frog-leg robot 131 picks up the wafer 161 from a first location (not shown), and then assumes a retracted position (FIG. 4A). It will be understood by those of ordinary skill in the art that mechanical and/or magnetic couplings driven by a motor within the hub 133 control the robot's movement as is conventionally known in the art of frog-leg robot design.

In the retracted position the lower arm portions 111a, 111b assume their normal state as shown and described with reference to FIG. 3A, satisfying equation 2. To assume the retracted position the first upper portion 139 rotates clockwise and the second upper portion 149 rotates counterclockwise about the central hub 133, drawing the first elbow 143 and second elbow 153 backward (i.e., away from the processing chamber 163). Because the first arm 135 and the second arm 137 are coupled in a closed loop (e.g., because the first arm 135 and the second arm 137 are coupled via the first hand 145 and the second hand 155 and because both arms are coupled to the central hub 133), the first adjustable lower portion 111a and the second adjustable lower portion 111b rotate about the elbows 143, 153 and the wrists 147, 157, respectively, as the first elbow 143 and the second elbow 153 draw backward.

Thus in the retracted position the inventive frog-leg robot 131 assumes its minimum overall length (i.e., has a length equal to the length of the adjustable lower arms 111a, 111b, in their normal (shorter) state and the length of the blade 159). As the retracted inventive frog-leg robot 131 rotates, for example from the first location to alignment with the wafer exchange port 167, it occupies a minimum axis of rotation indicated by the dashed circle 169 of FIG. 7 as described below.

Figure 1A:
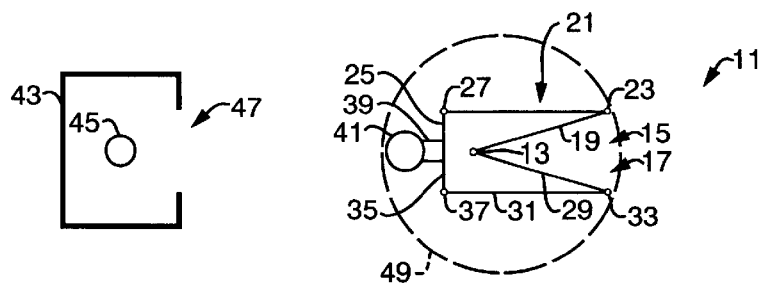
FIGS. 1A–E are schematic top views sequentially showing the operation of a conventional frog-leg robot.
Figure 1B:
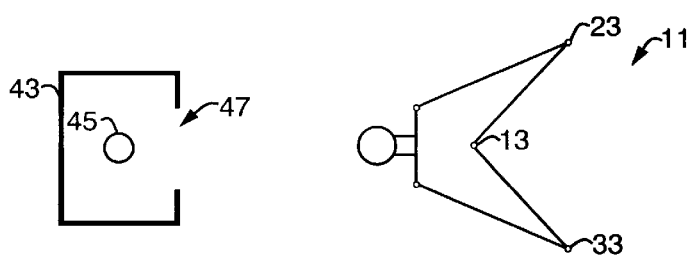
Figure 1C:
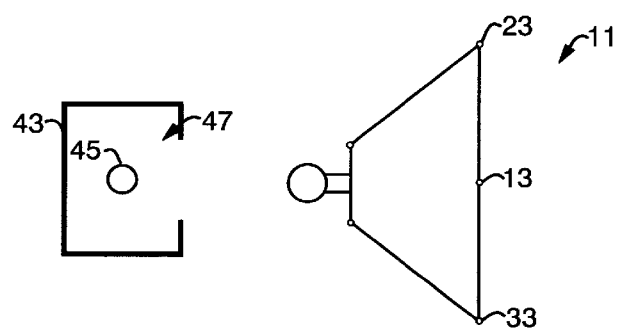
Figure 1D:
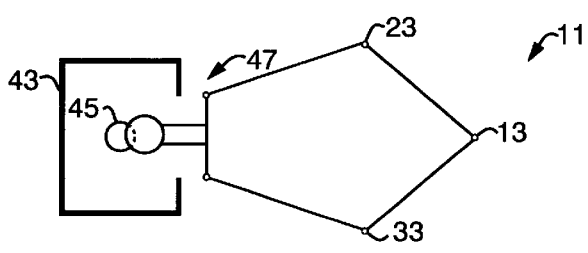
Figure 1E:
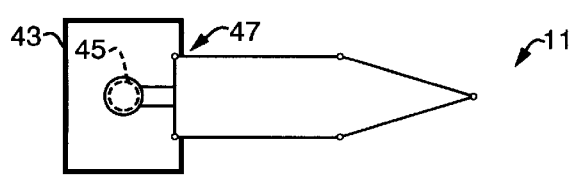
Figure 2A:
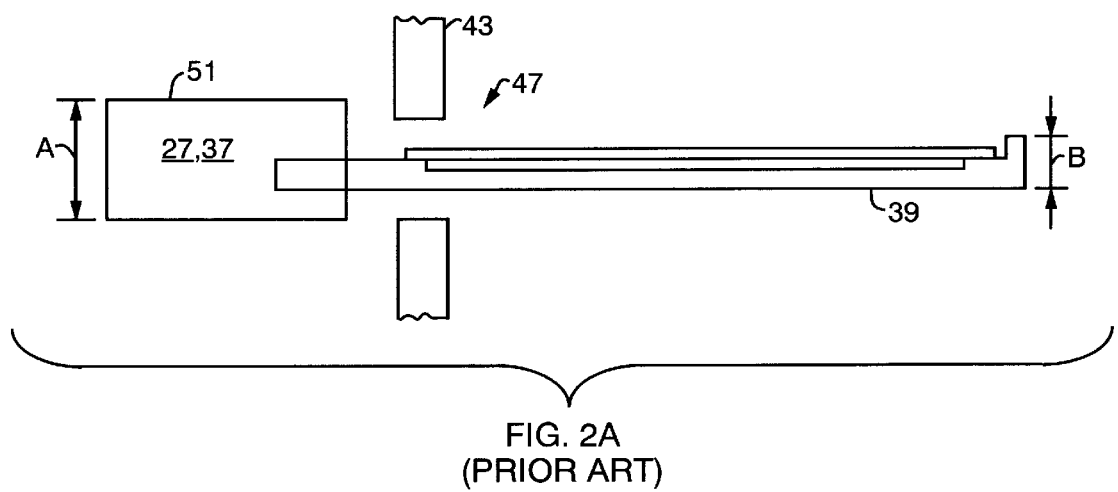
FIGS. 2A and 2B are a schematic side elevational view and a schematic top plan view, respectively, of the wrists and the blade of the frog-leg robot of FIG. 1, extending through a wafer exchange port to a wafer placement location.
Figure 2B:
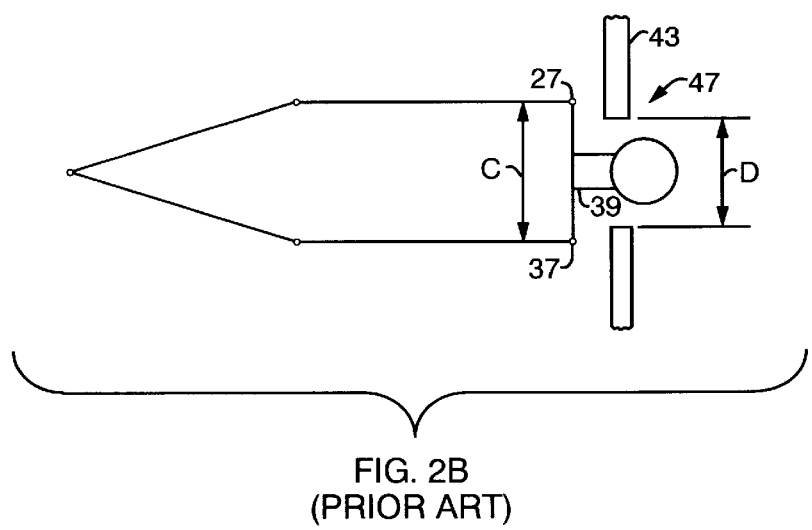

After the inventive frog-leg robot 131 is aligned with the wafer exchange port 167, the first upper portion 139 rotates counterclockwise while the second upper portion 149 rotates clockwise about the central hub 133, causing the inventive frog-leg robot 131 to reach forward (i.e., toward the processing chamber 163) until the frog-leg robot 131 assumes the object placement position as shown in FIG. 1E. Again, because the first arm 135 and the second arm 137 are coupled in a closed loop the first lower portion 111a and the second lower portion 111b rotate about the elbows 143, 153 and the wrists 147, 157, respectively.

The inventive frog-leg robot 131 is shown sequentially in FIGS. 4A–E moving from the retracted position to the placement position. FIG. 1B shows the inventive frog-leg robot 131 as it moves from a retracted position toward a center position, the first elbow 143 and the second elbow 153 being backward of the central hub 133.

FIG. 4C shows the inventive frog-leg robot 131 in a center position, with the first elbow 143 and the second elbow 153 directly in line with the central hub 133. As the inventive frog-leg robot 131 moves toward the center position (FIG. 4C) the first elbow 143 and second elbow 153 swing outward, and a tensile force is applied to the lower arm portions 111a, 111b (e.g., as the elbows 143, 153 move outward and the wrists 147, 157 remain fixed). The tensile force causes the extension spring 113 (FIGS. 3A and 3B) to stretch.

FIG. 4D shows the frog-leg robot 131 as it moves from the center position toward the placement position, the first elbow 143 and the second elbow 153 being forward of the central hub 133. As the inventive frog-leg robot 131 reaches the center position (FIG. 4C) the extension spring 113 (FIGS. 3A–B) stretches so that the robot satisfies equation 1 (i.e., so that the length of the lower arm portion 111a, 111b and ½ the distance between the wrists 147, 157 is at least equal to the length of the upper arm portions 139, 149). As the robot passes center (FIG. 4D) the elbows begin to swing inward and the tensile force applied to the lower arms 111a, 111b lessens, allowing the extension spring 113 to recoil.

Figure 4E:
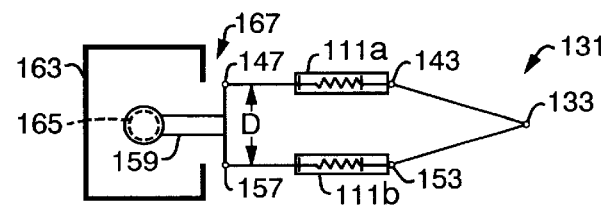

FIG. 4E shows the inventive frog-leg robot 131 in the placement position with the first elbow 143 and the second elbow 153 in line with the first wrist 147 and the second wrist 157, respectively. Accordingly, the adjustable lower arm portions 111a, 111b experience no tensile force, and the extension spring 113 recoils to its normal (shorter) state. As FIG. 4E shows, in order to reach the wafer placement location 165, only the blade 159 extends through the wafer exchange port 167, thereby allowing the wafer exchange port 167 to be smaller, and protecting the inventive frog-leg robot 131 from the harsh processing chamber environment. Note that FIG. 4E also shows (in phantom) that the distance D between the wrists 147 157 may be extendible.

Figure 5A:
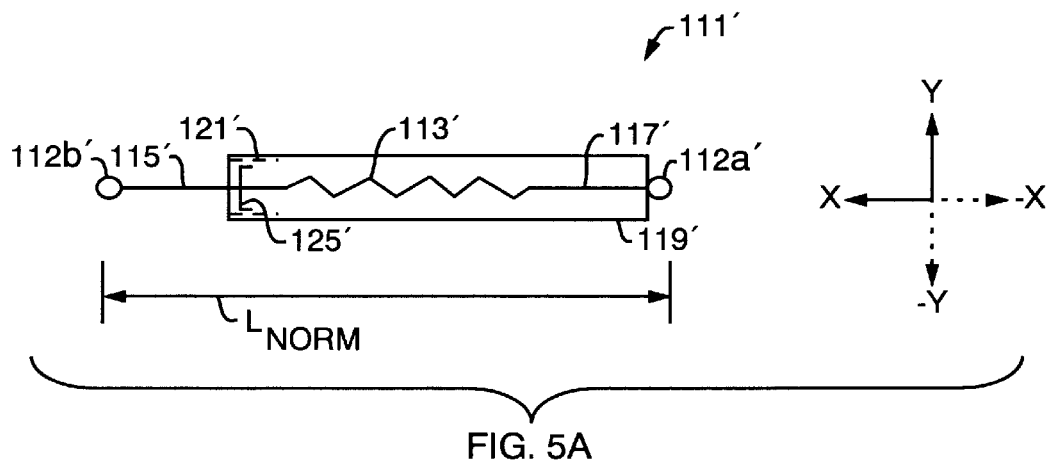
FIGS. 5A and 5B are side elevational views of a second embodiment of an adjustable portion for use in an inventive frog-leg robot.
Figure 5B:
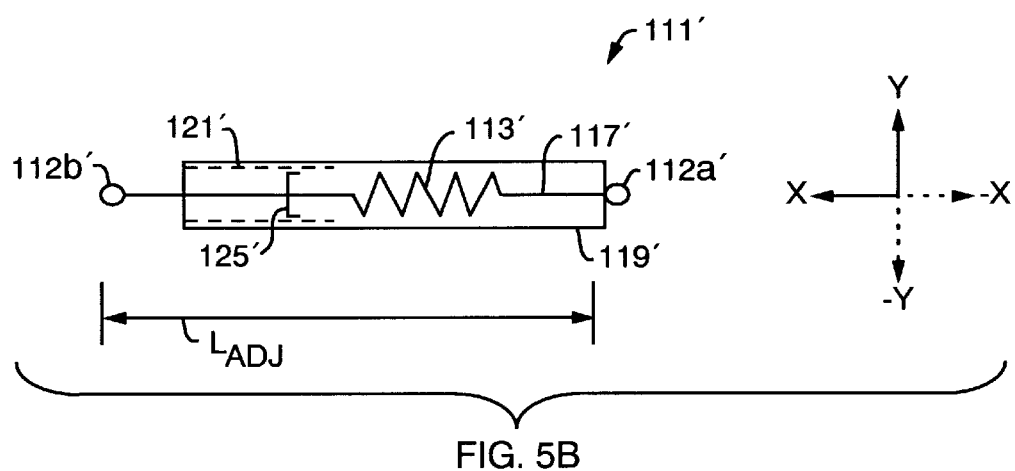

FIGS. 5A and 5B are side elevational views of a second embodiment of an adjustable portion for use in an inventive frog-leg robot. The second embodiment comprises an adjustable upper arm portion 111' shown in an extended state (FIG. 5A) and in a compressed state (FIG. 5B). The adjustable upper arm portion 111' comprises a first connector 112a' and a second connector 112b' that allow the adjustable upper arm portion 111' to rotatably connect to both a hub portion and a lower arm portion of an inventive frog-leg robot, as described below with reference to FIGS. 6A–E. As stated, such rotatable connections are well known in the art and are therefore not further described herein.

Coupled between the first and second connectors 112a', 112b' is an extension spring 113' that allows the adjustable upper arm portion 111' to extend and compress as described below. A first end 113a' of the extension spring 113' couples the first connector 112a' via a first rigid member 115', and a second end 113b' of the extension spring 113' couples the second connector 112b' via a second rigid member 117'.

Like the adjustable lower arm portion 111 of FIGS. 3A and 3B, the first rigid member 115', the extension spring 113', and the second rigid member 117' of the adjustable upper arm portion 111' of FIG. 5A form an adjustable upper arm portion that may extend and compress freely along a linear axis, such as the x axis of FIG. 5A. That is, the adjustable upper arm portion 111' may stretch from its "normal" length $L_{norm}$ (FIG. 5A) to its adjusted length $L_{adj}$ (FIG. 5B). Note that the normal length for the adjustable lower arm portion 111 of FIGS. 3A and 3B is its compressed length and that the normal length for the adjustable upper arm portion 111' of FIGS. 5A and 5B is its extended length; while the adjusted length for the lower arm portion 111 of FIGS. 3A and 3B is its extended length and the adjusted length for the upper arm portion 111' is its compressed length.

To provide lateral (y axis) support, a housing 119' is provided that surrounds the extension spring 113'. The housing 119' of the adjustable upper arm portion 111' of FIGS. 5A and 5B slideably couples to the first rigid member 115' via the linear bearing 121'.

The first rigid member 115', the second rigid member 117', and the housing 119' form a structure that is resistant to lateral (y axis) movement yet capable of expanding and contracting along a desired direction (e.g., along the x axis of FIGS. 5A and 5B). In addition to providing lateral rigidity, the housing 119' contains any contaminants that may be generated during the extension and compression of the extension spring 113'.

To limit the range of motion of the adjustable upper arm portion 111' a hard stop 125' is rigidly coupled to the first rigid member 115'. The hard stop 125' sets the maximum length ($L_{norm}$) of the adjustable upper arm portion 111' by limiting the extension of extension spring 113' (FIG. 5A). For example, the hard stop 125' may comprise a metal plate rigidly coupled to the first rigid member 115'. An opening in the housing 119' through which the first rigid member 115' travels as the extension spring 113' extends and compresses is smaller than the metal plate and therefore prevents the metal plate from exiting the housing 119' and thereby prevents the extension spring 113' from further expansion. The minimum length ($L_{min}$) the adjustable upper arm portion 111' compresses is determined by the minimum length to which the extension spring 117' (FIG. 5B) may compress.

FIGS. 6A–E are schematic top views sequentially showing the operation of an inventive frog-leg robot 131' which employs the adjustable upper arm portion 111' of FIGS. 5A and 5B. The inventive frog-leg robot 131' comprises a central hub 133' about which a first arm 135' and a second arm 137' rotate. The first arm 135' comprises a first adjustable upper portion 111a' the first connector 112a' of which rotatably couples the hub 133', and the second connector 112b' of which rotatably couples to a first lower portion 141' (forming a first elbow 143'). The first lower portion 141' further rotatably couples to a first hand 145' (forming a first wrist 147'). Similarly, the second arm 137' comprises a second adjustable upper portion 111b' the first connector 112a' of which rotatably couples to the central hub 133' and the second connector 112b' of which rotatably couples to a second lower portion 151' (forming a second elbow 153'). The second lower portion 151' further rotatably couples to a second hand 155' (forming a second wrist 157').

A blade 159' is coupled to both the first hand 145' and the second hand 155' at a distance halfway between the wrists 147', 157'. As shown in FIGS. 6A–E a wafer 161' is positioned on the blade 159', and the central hub 133' is positioned in front of a processing chamber 163' which encloses a wafer placement location 165'. The processing chamber 163' comprises a wafer exchange port 167' through which the inventive frog-leg robot 131' may transport wafers to and from the wafer placement location 165'.

In order to enable the inventive adjustable frog-leg robot to employ a longer blade without increasing the overall retracted axis of rotation, the inventive frog-leg robot is configured to satisfy the following equation:

$$L_{upper(norm)} > L_{lower} + \tfrac{1}{2}D_{wrist} \qquad \{equation\ 2\}$$

wherein:

$L_{upper(norm)}$ is the normal length of the upper portion of the first arm and the normal length of the upper portion of the second arm;

$L_{lower}$ is the length of the lower portion of the first arm and the length of the lower portion of the second arm; and $D_{wrist}$ is the distance between the first wrist and the second wrist.

However, as discussed previously with regard to the conventional frog-leg robot 11 of FIGS. 1A–E, in order for a frog-leg type robot to extend from a retracted position (FIG. 1A) past a center position (FIG. 1C) to a placement position (FIG. 1E) the frog-leg robot must be configured to satisfy the equation:

$$L_{upper} \leq L_{lower} + \tfrac{1}{2}D_{wrist} \qquad \{equation\ 1\}$$

wherein:

$L_{upper}$ is the length of the upper portion of the first arm and the length of the upper portion of the second arm;

$L_{lower}$ is the length of the lower portion of the first arm and the length of the lower portion of the second arm; and $D_{wrist}$ is the distance between the first wrist and the second wrist.

Figure 6A:
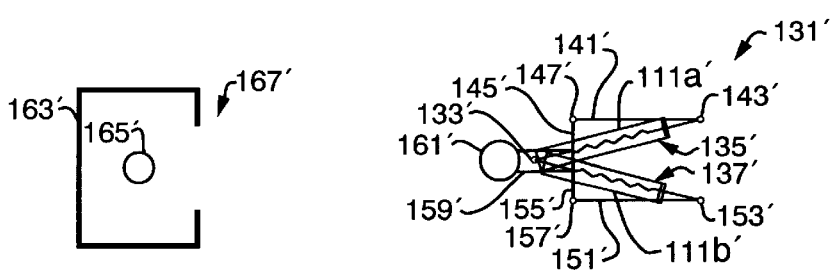
FIGS. 6A–E are schematic top views sequentially showing the operation of an inventive frog-leg robot which employs the adjustable upper arm portion of FIGS. 5A and 5B.

Accordingly, in order (1) to provide an increased blade length without increasing the overall retracted axis of rotation, and (2) to enable movement to/from a retracted position, past a center position, to/from a placement position; the adjustable upper arm portions of the inventive frog-leg robot assume an adjusted (shorter) length (so as to satisfy equation 1) when passing through the center position (FIGS. 6B–D) and assuming a normal (longer) length (so as to satisfy equation 2) when retracted (FIG. 6A). In the retracted position, the longer upper arm portions 111a', 111b' pull the lower arm portions 141', 151' past the center hub 113', which in turn pulls the longer blade 159' closer to the center hub 113'.

In operation, the inventive frog-leg robot 131' picks up the wafer 161' from a first location (not shown). The inventive frog-leg robot 131' then assumes a retracted position, wherein the adjustable upper arm portions 111a', 111b' assume their normal (longer) state (FIG. 5A) satisfying equation 2, and pulling the lower portions 141', 151' and the blade 159' further inward toward the central hub 113'. To assume the retracted position the first upper portion 111a' rotates clockwise and the second upper portion 111b' rotates counterclockwise about the central hub 133', drawing the first elbow 143' and second elbow 153' backward (i.e., away from the processing chamber 163'). Because the first arm 135' and the second arm 137' are coupled in a closed loop, the first lower portion 141' and the second lower portion 151' rotate about the elbows 143', 153', and the wrists 147', 157', respectively, as the first elbow 143' and the second elbow 153' draw backward. Thus in the retracted position the inventive frog-leg robot 131' assumes its minimum overall length (i.e., has a length equal to the length of the lower arms 141', 151' and the length of the blade 159'). As the retracted frog-leg robot 131' rotates, for example from a first location (not shown) to alignment with the wafer exchange port 167', it occupies a minimum axis of rotation indicated by the dashed circle 169' of FIG. 7.

Figure 6B:
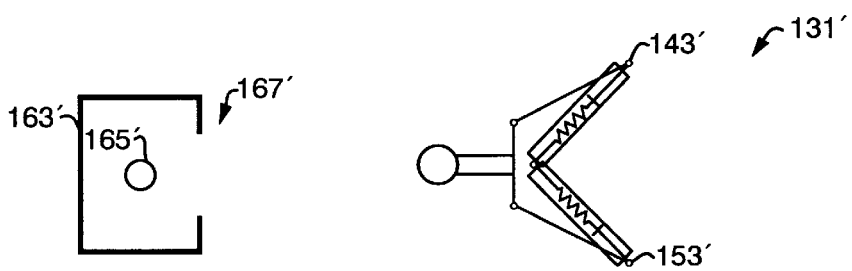
Figure 6C:
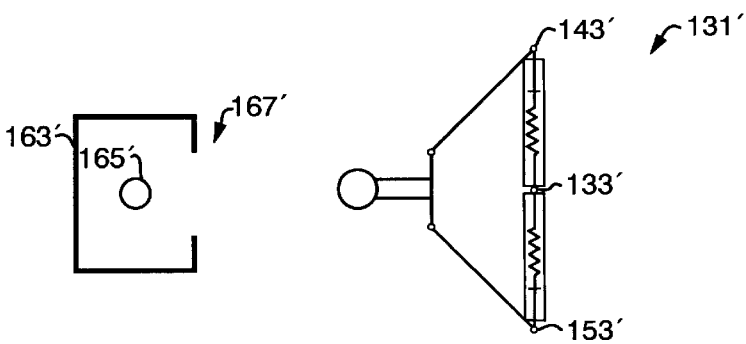
Figure 6D:
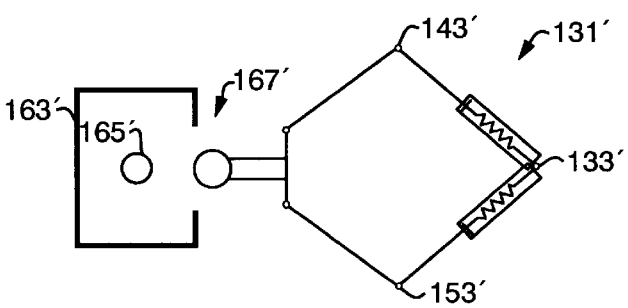
Figure 6E:
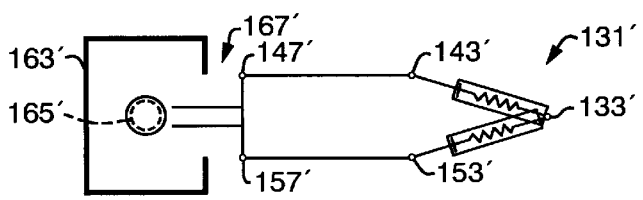

After the inventive frog-leg robot 131' is aligned with the wafer exchange port 167', the first upper portion 111a' rotates counterclockwise while the second upper portion 111b' rotates clockwise about the central hub 133', causing the inventive frog-leg robot 131' to reach forward (i.e., toward the processing chamber 163') until the inventive frog-leg robot 131' assumes the object placement position (FIG. 6E). Because the first arm 135' and the second arm 137' are coupled in a closed loop the first lower portion 141' and the second lower portion 151' rotate about the elbows 143', 153' and the wrists 147', 157', respectively. The frog-leg robot 131' is shown sequentially in FIGS. 6A–E moving from the retracted position to the placement position.

FIG. 6B shows the inventive frog-leg robot 131' as it moves from a retracted position toward a center position, the first elbow 143' and the second elbow 153' being backward of the central hub 133'. As the frog-leg robot 131' moves toward the center position, the first elbow 143' and second elbow 153' swing outward, and a compressive force is applied to the upper arm portions 111a', 111b'. As the elbows 143', 153' move outward and the wrists 147', 157' remain fixed, the shorter, lower arm portions 141', 151' (which have a fixed length) apply a compressive force to the adjustable upper arms 111a', 111b' causing the extension spring 113' (FIGS. 5A and 5B) to compress.

FIG. 6C shows the inventive frog-leg robot 131' in a center position, with the first elbow 143' and the second elbow 153' directly in line with the central hub 133'. As the inventive frog-leg robot 131' reaches the center position (FIG. 6C) the extension spring 113' compresses so that the inventive frog-leg robot 131' satisfies equation 1 (i.e., so that the length of the lower arm portion 141', 151' and ½ the distance between the wrists 147', 157' is at least equal to the length of the upper arm portions 111a', 111b').

FIG. 6D shows the inventive frog-leg robot 131' as it moves from the center position (FIG. 6C) toward the placement position (FIG. 6E), the first elbow 143' and the second elbow 153' being forward of the central hub 133'. As the inventive frog-leg robot 131' passes center (FIG. 6D) the elbows 143', 153' begin to swing inward and the compressive force applied to the upper arms 111a', 111b' lessons, allowing the extension spring 113' (FIG. 6E) to begin to expand.

FIG. 6E shows the inventive frog-leg robot 131' in the placement position with the first elbow 143' and the second elbow 153' in line with the first wrist 147' and the second wrist 157', respectively. Accordingly, the upper arm portions 111a', 111b' no longer experience compressive forces, and the extension springs 133' (FIGS. 5A–B) expand to their normal (longer) length. In order to reach the wafer placement location 165', only the blade 159' extends through the wafer exchange port 167', thereby allowing the wafer exchange port 167' to be smaller, and protecting the inventive robot 131' from the harsh processing chamber environment.

Figure 7A:
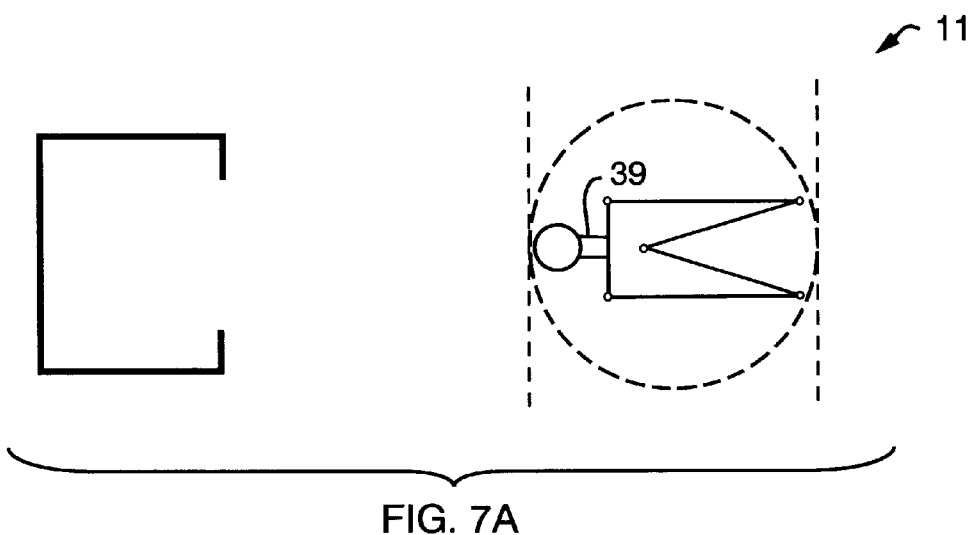
FIGS. 7A–C are schematic top plan views showing a retracted axis of rotation of the conventional frog-leg robot (FIG. 7A), a retracted axis of rotation of the inventive frog-leg robot (FIG. 7B), and a retracted axis of rotation of the inventive frog-leg robot (FIG. 7C)
Figure 7B:
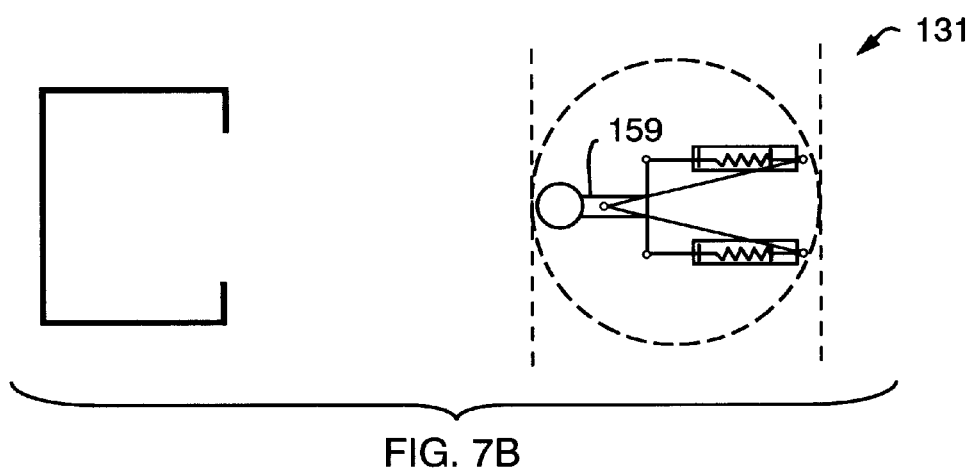
Figure 7C:
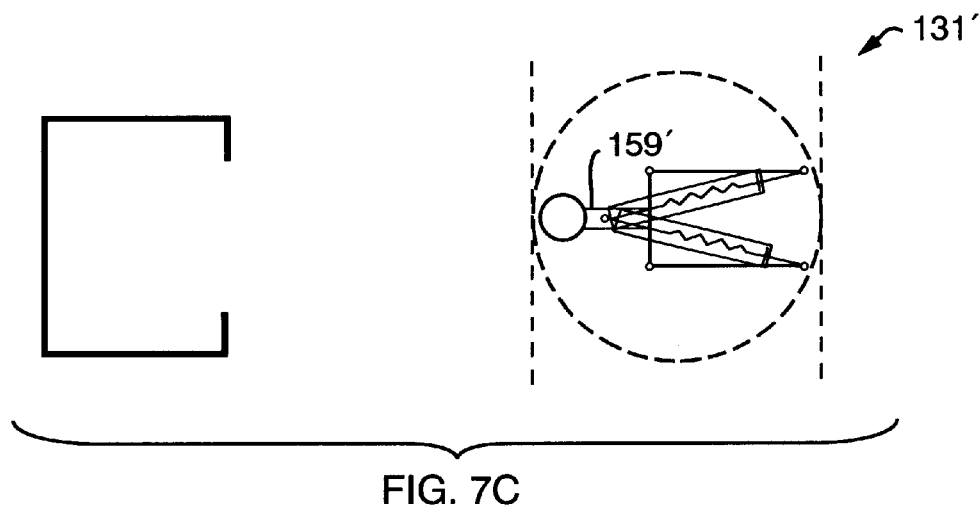

FIGS. 7A–C are schematic top plan views showing a retracted axis of rotation of the conventional frog-leg robot 11 (FIG. 7A), a retracted axis of rotation of the inventive frog-leg robot 131 (FIG. 7B), and a retracted axis of rotation of the inventive frog-leg robot 131' (FIG. 7C). As FIGS. 7A–C depict, despite the fact that the blade 159 (FIG. 7B) and the blade 159' (FIG. 7C) employed with the inventive frog-leg robots 131, 131' are longer than the blade employed with the conventional frog-leg robot, the retracted axis of rotation of the inventive frog-leg robots 131, 131' are no larger than the retracted axis of rotation of the conventional frog-leg robot 11. Accordingly the each inventive frog-leg robots achieve all the advantages associated with the longer blade; protecting the robot from the chamber, allowing smaller wafer exchange ports, reducing the probability of chamber contamination, etc., without requiring additional clean room space.

Figure 8A:
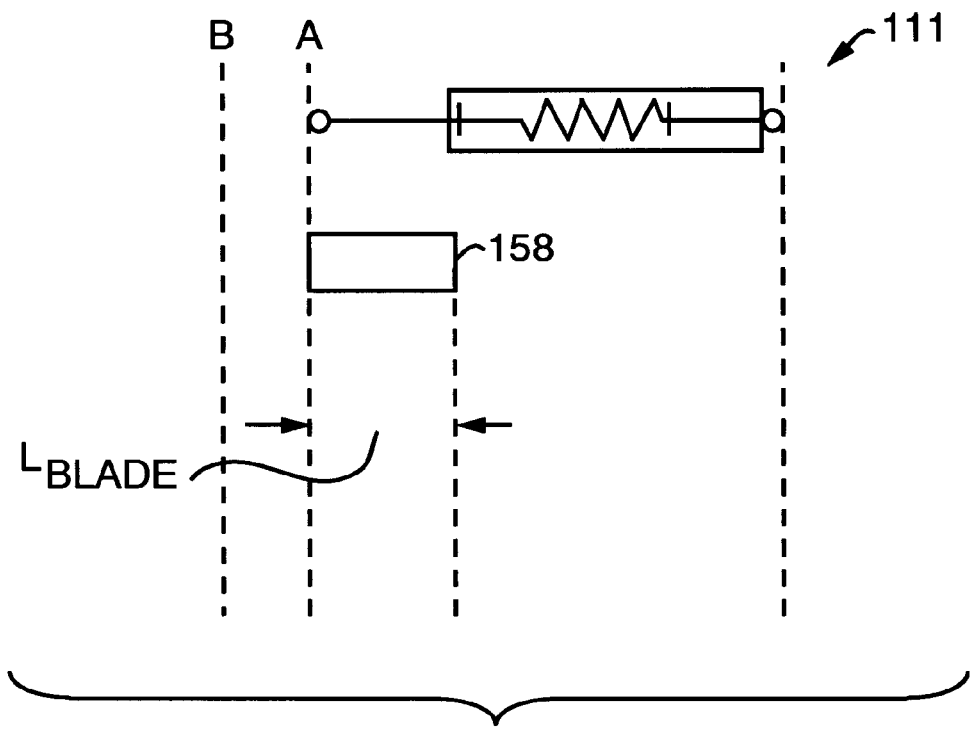
FIGS. 8A and 8B are schematic top plan views of the adjustable lower arm, useful in explaining the amount by which a blade may lengthen without increasing a robot's retracted axis of rotation.
Figure 8B:
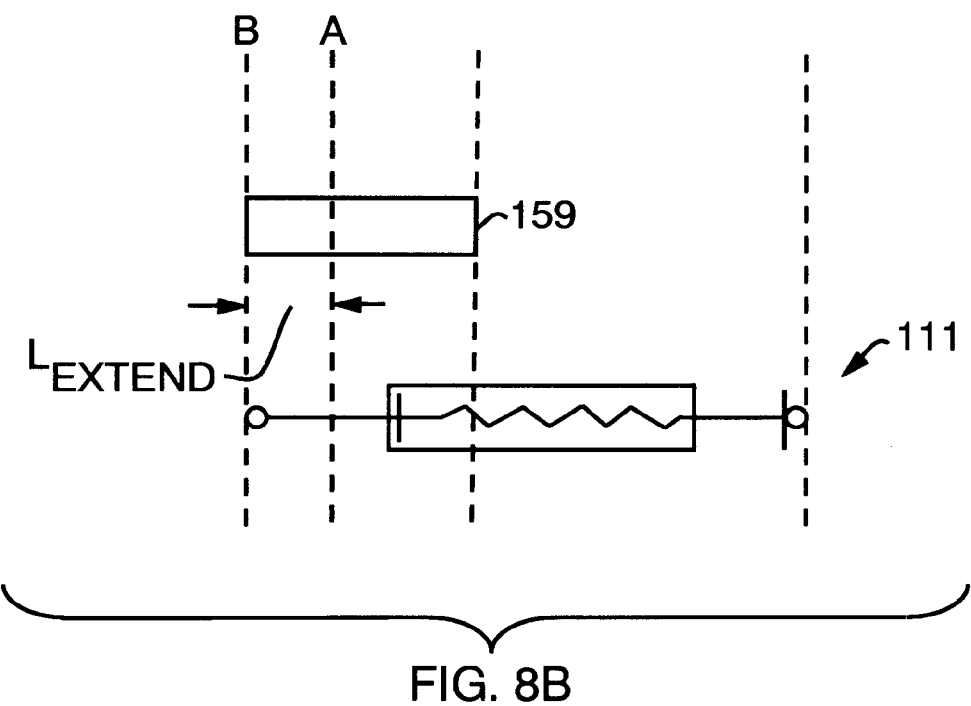

FIGS. 8A and 8B are schematic top plan views of the adjustable lower arm 111, useful in explaining the amount by which the blade may lengthen without increasing the robot' s retracted axis of rotation.

FIG. 8A shows the adjustable lower arm 111 in its normal state (e.g., the state exhibited when the inventive frog-leg robot is in a retracted position), juxtaposed to a blade 158 having an exemplary length $L_{blade}$. FIG. 8B shows the adjustable lower arm 111 in its expanded state (e.g., the state exhibited when the inventive frog-leg robot is in a center position), juxtaposed to an elongated blade 159. In its expanded state (e.g., in the center position) the lower arm 111 expands from point A to point B, a distance indicated in FIG. 8B as $L_{extend}$. Thus, because the adjustable lower arm 111 is normally shorter (e.g., in the retracted position) by a distance $L_{adjust}$ the blade 159 may be elongated by the distance $L_{adjust}$. Similarly, an inventive frog-leg robot employing an adjustable upper arm 111' can employ a blade elongated by an amount equal to the distance the upper arm adjusts between the retracted position and the center position.

Figure 9A:
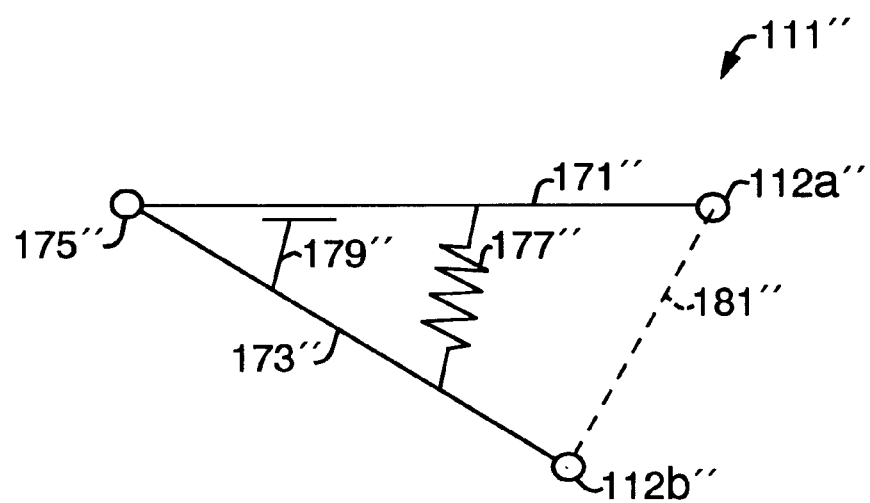
FIG. 9A is a schematic top plan view of a wing type adjustable lower arm portion at its minimum (normal) length and FIG. 9B shows the wing type adjustable lower arm at an adjusted (longer) length.
Figure 9B:
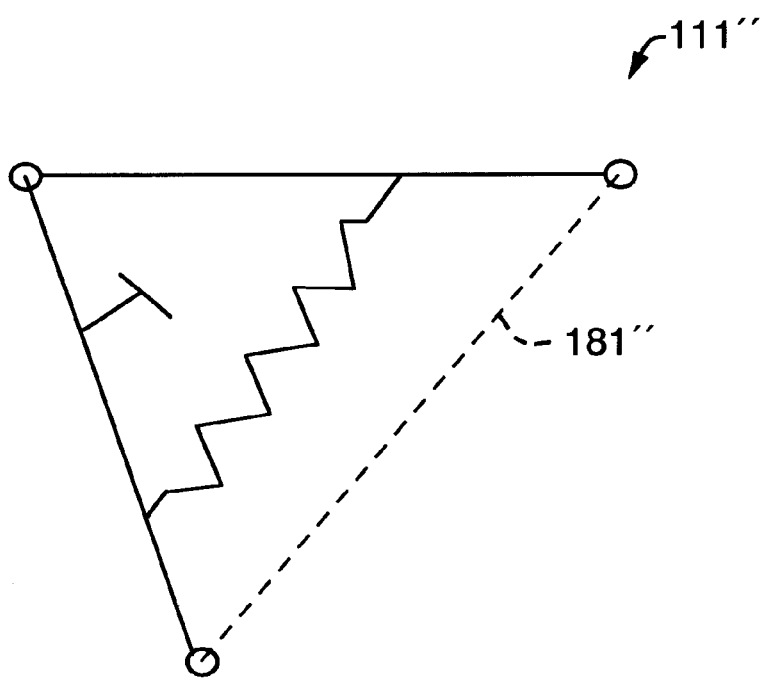

FIG. 9A is a schematic top plan view of an alternative adjustable portion of an inventive frog-leg robot, comprising a wing type adjustable lower arm 111". The wing type adjustable lower arm 111" comprises a first link 171" having a first connector 112a" for coupling to an upper arm portion (not shown) and a second link 173" having a second connector 112b" for coupling to a hand portion (not shown). The first and second links 171", 173" rotatably couple to each other forming a wing joint 175". An extension spring 177" couples to both the first link 171" and the second link 173" so as to limit the maximum angle between the first link 171" and the second link 173". Similarly, a hard stop 179" is operatively coupled between the first link 171" and the second link 173" so as to limit the minimum angle between the first and second links 171", 173". Accordingly, the wing type adjustable arm portion 111" has an " effective" length 181" indicated in phantom in FIGS. 9A and 9B. FIG. 9A shows the wing type adjustable lower arm portion 111" at its minimum (normal) length and FIG. 9B shows the wing type adjustable lower arm 111" at an adjusted (longer) length.

The foregoing description discloses only the preferred embodiments of the invention, modifications of the above disclosed apparatus and method which fall within the scope of the invention will be readily apparent to those of ordinary skill in the art. For instance, a given wafer handler may have both upper and lower adjustable arm portions. In addition to the lower and upper arm portions 111, 111', the first and second hands 145, 145', 147, 147' may adjust (e.g., expand) to allow the inventive frog-leg robot to pass through the center position yet maintaining the desired retracted axis of rotation despite use of a longer blade. Furthermore, the adjustable lower arm portions may extend while the inventive frog-leg robot is in the wafer placement position allowing the adjustable lower arm portions to have an even shorter normal (i.e., non-adjusted) length.

Accordingly, while the present invention has been disclosed in connection with the preferred embodiments thereof, it should be understood that other embodiments may fall within the spirit and scope of the invention, as defined by the following claims.

The invention claimed is:

1. A robot assembly comprising:
  a central hub having an axis;
  a first arm having an upper portion rotatably coupled to the central hub and a lower portion rotatably coupled to the upper portion of the first arm, wherein at least one of the upper and lower portions of the first arm is adjustable between a normal length and an adjusted length; and
  a second arm having an upper portion rotatably coupled to the central hub and a lower portion rotatably coupled to the upper portion of the second arm, wherein at least one of the upper and lower portions of the second arm is adjustable in length between a normal length and an adjustable length and wherein the lower portion of the first arm and the lower portion of the second arm are coupled.

2. The robot assembly of claim 1 wherein the upper portion of the first arm is rotatably coupled to central hub so that the upper portion of the first arm rotates about the central hub within a first plane and wherein the lower portion of the first arm is rotatably coupled to the upper portion of the first arm so that the lower portion of the first arm rotates about the upper portion of the first arm within the first plane; and wherein the upper portion of the second arm is rotatably coupled to central hub so that the upper portion of the second arm rotates about the central hub within the first plane and wherein the lower portion of the second arm is rotatably coupled to the upper portion of the second arm so that the lower portion of the second arm rotates about the upper portion of the second arm within the first plane.

3. The robot assembly of claim 2 further comprising:

a first wrist rotatably coupled to the lower portion of the first arm; and a second wrist rotatably coupled to the lower portion of the second arm, wherein the first wrist is rigidly coupled to the second wrist.

4. The robot assembly of claim 3 wherein the upper portion of the first arm and the upper portion of the second arm are configured such that when the first and second arms are centered the lower portion of the first arm and the lower portion of the second arm adjust to a length greater than the normal length.

5. The robot assembly of claim 4 wherein the length of upper portion of the first arm and the length of the upper portion of the second arm are the same length ($L_{upper}$), wherein the normal length of the lower portion of the first arm and the normal length of the lower portion of the second arm are the same length ($L_{lower(min)}$) wherein the distance between the first wrist and second wrist is distance ($D_{wrist}$), and wherein the robot assembly is configured according to the following equation:

$$L_{upper} > L_{lower(min)} + \tfrac{1}{2} D_{wrist}.$$

6. The robot assembly of claim 3 wherein the lower portion of the first arm and the lower portion of the second arm are configured such that when the first and second arms are centered the upper portion of the first arm and the upper portion of the second arm adjust to a length less than the normal length.

7. The robot assembly of claim 6 wherein the normal length of upper portion of the first arm and the normal length of the upper portion of the second arm are the same length ($L_{upper(max)}$), wherein the length of the lower portion of the first arm and the length of the lower portion of the second arm are the same length ($L_{lower}$), wherein the distance between the first wrist and second wrist is distance ($D_{wrist}$), and wherein the robot assembly is configured according to the following equation:

$$L_{upper(max)} > L_{lower} + \tfrac{1}{2} D_{wrist}.$$

8. The robot assembly of claim 2 wherein the lower portion of the first arm comprises a linear bearing and wherein the lower portion of the second arm comprise linear bearing.

9. The robot assembly of claim 2 wherein the lower portion of the first arm comprises a wing type adjustable lower arm and the lower portion of the second arm comprises a wing type adjustable lower arm.

10. A system comprising:

an object placement location; and a robot assembly operatively coupled to the object placement location, the robot assembly comprising:

a central hub having an axis;

a first arm having an upper portion rotatably coupled to the central hub and a lower portion rotatably coupled to the upper portion of the first arm, wherein at least one of the upper and lower portions of the first arm is adjustable between a normal length and an adjusted length; and a second arm having an upper portion rotatably coupled to the central hub and a lower portion rotatably coupled to the upper portion of the second arm, wherein at least one of the upper and lower portions of the second arm is adjustable in length between a normal length and an adjustable length and wherein the lower portion of the first arm and the lower portion of the second arm are coupled.

11. The system of claim 10 further comprising a chamber surrounding the object placement location, the chamber having a load port through which a portion of the robot assembly may transport an object to and from the object placement location.

12. The system of claim 11 wherein the robot assembly further comprises:

a blade operatively coupled to the lower portion of the first arm and the lower portion of the second arm of the robot assembly, wherein the blade has a length at least as long as the distance between the load port and the object placement location.

13. The system of claim 10 wherein the center axis is positioned a distance from the object placement location such that the lower arm adjusts to a length greater than the normal length in order to place an object on the object placement location.

14. The system of claim 10 wherein the robot assembly comprises:

a retracted position wherein the central hub is located between the object placement location and both the upper and lower portions of the first arm and the upper and lower portions of the second arm;

a centered position, wherein the upper portion of the first arm and the upper portion of the second arm form an approximately 180° angle and wherein the lower portion of the first arm and the lower portion of the second are located between the object placement location and the central hub; and an extended position, wherein the both the upper and lower portions of the first arm and the upper and lower portions of the second arm are located between the object placement location and the central hub.

15. The system of claim 14 wherein the lower portion of the first arm and the lower portion of the second arm adjust from the normal length to an extended length as the robot moves between the retracted position and the center position; and wherein the lower portion of the first arm and the lower portion of the second arm adjust from the extended length to the normal length as the robot moves between the center position and the extended position.

16. The system of claim 14 wherein the upper portion of the first arm and the upper portion of the second arm adjust from the normal length to a compressed length as the robot moves between the retracted position and the center position; and wherein the upper portion of the first arm and the upper portion of the second arm adjust from the compressed length to the normal length as the robot moves between the center position and the extended position.

17. A method of operation of an adjustable frog leg robot having a pair of arms, each arm comprising an upper portion rotatably coupled a lower portion, the method comprising:

assuming a retracted position;

assuming a center position, wherein the length of at least one of the upper and lower portions of each arm adjusts from a normal length to an adjusted length as the robot moves between the retracted position and the center position; and assuming an extended position, wherein the length of the least one of the upper and lower portions of each arm adjusts from the adjusted length to the normal length as the robot moves between the center position and the extended position.

18. The method of claim 17 wherein the lower portion of each arm adjusts from the normal length to an extended length as the robot moves between the retracted position and the center position, and from the extended length to the normal length as the robot between the centered position and the extended position.

19. The method of claim 17 wherein the upper portion of each arm adjusts from the normal length to a compressed length as the robot moves between the retraced position and the center position, and from the compressed length to the normal length as the robot moves between the centered position and the extended position.

20. A method of object transport between a first object location within a chamber having a load port, and a second object location external to the chamber comprising:

providing an adjustable length frog leg robot comprising:
a central hub having an axis;
a first arm having an upper portion rotatable coupled to the central hub and a lower portion rotatable coupled to the upper portion of the first arm, wherein at least one of the upper and lower portions of the first arm is adjustable between a normal length and an adjusted length; and
a second arm having an upper portion rotatable coupled to the central hub and a lower portion rotatable coupled to the upper portion of the second arm, wherein at least one of the upper and lower portions of the second arm is adjustable in length between a normal length and an adjustable length;

providing the adjustable length frog leg robot with a blade having a known length, the blade for transporting an object between the first and second object locations;

aligning the adjustable length frog leg robot with the first object location;

assuming an extended position so that the blade reaches the first object location and may extract an object located therein;

assuming a retracted position such that when the lengths of the at least one of the upper and lower portions of each arm assumes the normal position, the adjustable length frog leg robot travels in a smaller circumference path during rotation than would a non-adjustable frog leg robot having the known blade length; and rotating the retracted robot from alignment with the first object location to alignment with the second object locations.

21. A robot assembly comprising:
a central hub having an axis;
a first arm having an upper portion rotatably coupled to the central hub, a lower portion rotatably coupled to the upper portion of the first arm, and a wrist rotatably coupled to the lower portion of the first arm; and
a second arm having an upper portion rotatably coupled to the central hub, a lower portion rotatably coupled to the upper portion of the second arm, and a wrist rotatably coupled to the lower portion of the second arm and coupled to the wrist of the first arm;
wherein a distance between the wrists of the first and second arms is extendible.

22. A system comprising:
an object placement location; and
a robot assembly operatively coupled to the object placement location, the robot assembly comprising:
a central hub having an axis;
a first arm having an upper portion rotatably coupled to the central hub and a lower portion rotatably coupled to the upper portion of the first arm, wherein at least one of the upper and lower portions of the first arm is adjustable between a normal length and an adjusted length;
a second arm having an upper portion rotatably coupled to the central hub and a lower portion rotatably coupled to the upper portion of the second arm, wherein at least one of the upper and lower portions of the second arm is adjustable in length between a normal length and an adjustable length;
a retracted position wherein the central hub is located between the object placement location and both the upper and lower portions of the first arm and the upper and lower portions of the second arm;
a centered position, wherein the upper portion of the first arm and the upper portion of the second arm form an approximately 180° angle and wherein the lower portion of the first arm and the lower portion of the second are located between the object placement location and the central hub; and
an extended position, wherein the both the upper and lower portions of the first arm and the upper and lower portions of the second arm are located between the object placement location and the central hub;
wherein the lower portion of the first arm and the lower portion of the second arm adjust from the normal length to an extended length as the robot moves between the retracted position and the center position, and wherein the lower portion of the first arm and the lower portion of the second arm adjust from the extended length to the normal length as the robot moves between the center position and the extended position.

23. A system comprising:
an object placement location; and
a robot assembly operatively coupled to the object placement location, the robot assembly comprising:
a central hub having an axis;
a first arm having an upper portion rotatably coupled to the central hub and a lower portion rotatably coupled to the upper portion of the first arm, wherein at least one of the upper and lower portions of the first arm is adjustable between a normal length and an adjusted length;
a second arm having an upper portion rotatably coupled to the central hub and a lower portion rotatably coupled to the upper portion of the second arm, wherein at least one of the upper and lower portions of the second arm is adjustable in length between a normal length and an adjustable length;

a retracted position wherein the central hub is located between the object placement location and both the upper and lower portions of the first arm and the upper and lower portions of the second arm;

a centered position, wherein the upper portion of the first arm and the upper portion of the second arm form an approximately 180° angle and wherein the lower portion of the first arm and the lower portion of the second are located between the object placement location and the central hub; and an extended position, wherein the both the upper and lower portions of the first arm and the upper and lower portions of the second arm are located between the object placement location and the central hub;

wherein the upper portion of the first arm and the upper portion of the second arm adjust from the normal length to a compressed length as the robot moves between the retracted position and the center position, and wherein the upper portion of the first arm and the upper portion of the second arm adjust from the compressed length to the normal length as the robot moves between the center position and the extended position.

* * * * *